(12) United States Patent
Watanabe

(10) Patent No.: US 11,340,259 B2
(45) Date of Patent: May 24, 2022

(54) PROBE CARD MANAGEMENT SYSTEM AND PROBE CARD MANAGEMENT METHOD

(71) Applicant: TOKYO ELECTRON LIMITED, Tokyo (JP)

(72) Inventor: Shinjiro Watanabe, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 148 days.

(21) Appl. No.: 16/709,285

(22) Filed: Dec. 10, 2019

(65) Prior Publication Data
US 2020/0191830 A1 Jun. 18, 2020

(30) Foreign Application Priority Data
Dec. 12, 2018 (JP) .............................. JP2018-232124

(51) Int. Cl.
*G01R 1/073* (2006.01)

(52) U.S. Cl.
CPC ..... *G01R 1/07342* (2013.01); *G01R 1/07364* (2013.01)

(58) Field of Classification Search
CPC ............ G01R 1/07342; G01R 1/07364; G01R 31/287; G01R 3/00; G01R 31/2601; G01R 35/00; G01N 21/8851; G01N 2021/8887
See application file for complete search history.

(56) References Cited

U.S. PATENT DOCUMENTS

| | | | | |
|---|---|---|---|---|
| 5,644,245 | A * | 7/1997 | Saitoh ................ | G01R 1/06794 324/750.18 |
| 2007/0170937 | A1* | 7/2007 | Endou ................ | G01R 31/2891 324/754.03 |

FOREIGN PATENT DOCUMENTS

| | | | |
|---|---|---|---|
| JP | 02159742 | * | 6/1990 |
| JP | 2009-162723 A | | 7/2009 |

OTHER PUBLICATIONS

English machine translation of Kishibe JPH02159742 (Kishibe). (Year: 1990).*

* cited by examiner

*Primary Examiner* — Lee E Rodak
(74) *Attorney, Agent, or Firm* — Nath, Goldberg & Meyer; Jerald L. Meyer; Tanya E. Harkins

(57) ABSTRACT

A probe card management system includes inspection apparatuses that inspect an inspection object and a management apparatus that manages a state of a probe card. Each inspection apparatus includes a camera that captures an image of a tip of each needle provided on the probe card, an inspection part that measures a state of the tip from the image, and inspects the inspection object by bringing the tip into contact with each test pad based on the measurement result, and supplying an electrical signal to the inspection object through the tip; and a transmission part that transmits the measurement result and a number of executions of the inspection to the management apparatus. The management apparatus includes a threshold specification part that specifies a first threshold value, and a notification part that notifies an outside of the number of executions and the first threshold value.

15 Claims, 10 Drawing Sheets

| Card ID | Cumulative Contact Number | 1st Threshold | 2nd Threshold |
|---|---|---|---|
| C001 | 420 | 14300 | 12200 |
| C002 | 5720 | 20100 | 18100 |
| C003 | 15900 | 17900 | 15950 |
| ⋮ | ⋮ | ⋮ | ⋮ |

PROBE CARD MANAGEMENT SYSTEM AND PROBE CARD MANAGEMENT METHOD

CROSS-REFERENCE TO RELATED APPLICATION

This application is based upon and claims the benefit of priority from Japanese Patent Application No. 2018-232124, filed on Dec. 12, 2018, the entire contents of which are incorporated herein by reference.

TECHNICAL FIELD

Various aspects and embodiments of the present disclosure relate to a probe card management system and a probe card management method.

BACKGROUND

For example, Patent Document 1 below discloses a test apparatus including a substrate stage, a probe card, an imaging part, and a determination part. The probe card includes a probe for applying a test signal to a wafer W placed on the substrate stage. The imaging part obtains an image of the probe. The determination part determines whether or not the tip of the probe is abnormal based on a difference between the images of the probe before and after performing a test.

PRIOR ART DOCUMENT

Patent Documents

Patent Document 1: Japanese Laid-Open Patent Publication No. 2009-162723

SUMMARY

According to an embodiment of the present disclosure, there is provided a probe card management system including: a plurality of inspection apparatuses each configured to inspect an inspection object; and a management apparatus configured to manage a state of a probe card used for inspecting the inspection object. Each of the plurality of inspection apparatuses includes: a camera configured to capture images of tips of a plurality of probe needles provided on the probe card; an inspection part configured to measure a state of the tip of each of the plurality of probe needles from the images captured by the camera; and inspect the inspection object by bringing the tip of each of the plurality of probe needles into contact with each of a plurality of test pads provided on the inspection object based on a result of the measurement, and supplying an electrical signal to the inspection object through the tips of the plurality of probe needles; and a transmission part configured to transmit the measurement result and a number of executions of the inspection performed by the probe card to the management apparatus. The management apparatus includes: a threshold specification part configured to specify, for each probe card, a first threshold indicating a threshold for the number of executions until a lifespan of the probe card expires, based on the measurement result and the number of executions; and a notification part configured to notify an outside of the number of executions up to now and the first threshold value for each probe card.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of a probe card management system and a probe card management method disclosed herein will be described in detail with reference to the drawings. The following embodiments are not intended to limit the probe card management system and the probe card management method disclosed herein.

In a case where the number of wafers to be inspected is small, there may be a small change between the state of a probe needle before inspection and the state of the probe needle after inspecting a plurality of wafers. As such, in a case of determining whether or not the state of the probe needle after inspecting the plurality of wafers is abnormal on the basis of the state of the probe needle before inspection, it is often determined that the state of the probe needle is normal.

However, when the inspection of a predetermined number of wafers is performed a multiple number of times, even if the state of the probe needle is determined to be normal before and after each inspection, the state of the probe needle may gradually change and may be abnormal. Therefore, when an abnormality is determined by comparing the states of the probe needle before and after inspection, it is difficult to correctly detect the abnormality of the state of the probe needle (e.g., the life of the probe card).

In addition, when an abnormality of the probe needle is detected after the inspection, it is difficult to determine which inspection result was performed using a normal probe needle among the inspection results so far. Therefore, all the inspection results may become useless. Accordingly, it is desirable to estimate, before performing the inspection, whether or not the lifespan of the probe card will expire during the inspection.

Therefore, the present disclosure provides a technique capable of accurately managing the lifespan of a probe card.

[Configuration of Probe Card Management System 1]

Figure 1:
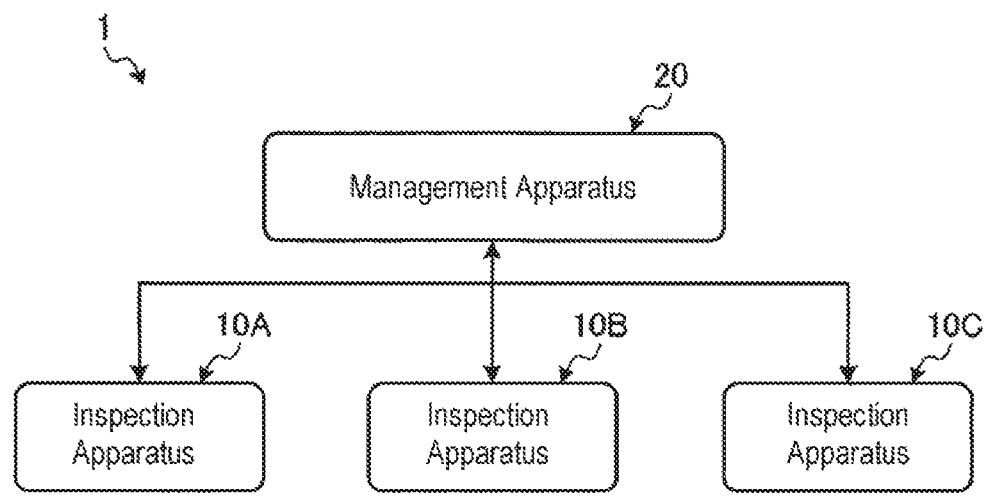
FIG. 1 is a system configuration view illustrating an example of a probe card management system according to an embodiment of the present disclosure.

FIG. 1 is a view illustrating an example of a probe card management system 1 according to an embodiment of the present disclosure. For example, as illustrated in FIG. 1, the probe card management system 1 includes a management apparatus 20 and a plurality of inspection apparatus 10A, 10B, and 10C. The management apparatus 20 and each of the inspection apparatus 10A, 10B, and 10C are connected to each other in a communicable relationship with each other via a wired line or a wireless line. Hereinafter, the inspection apparatuses 10A, 10B, and 10C may be collectively referred to as an inspection apparatus 10 without being distinguished from one another.

Figure 2:
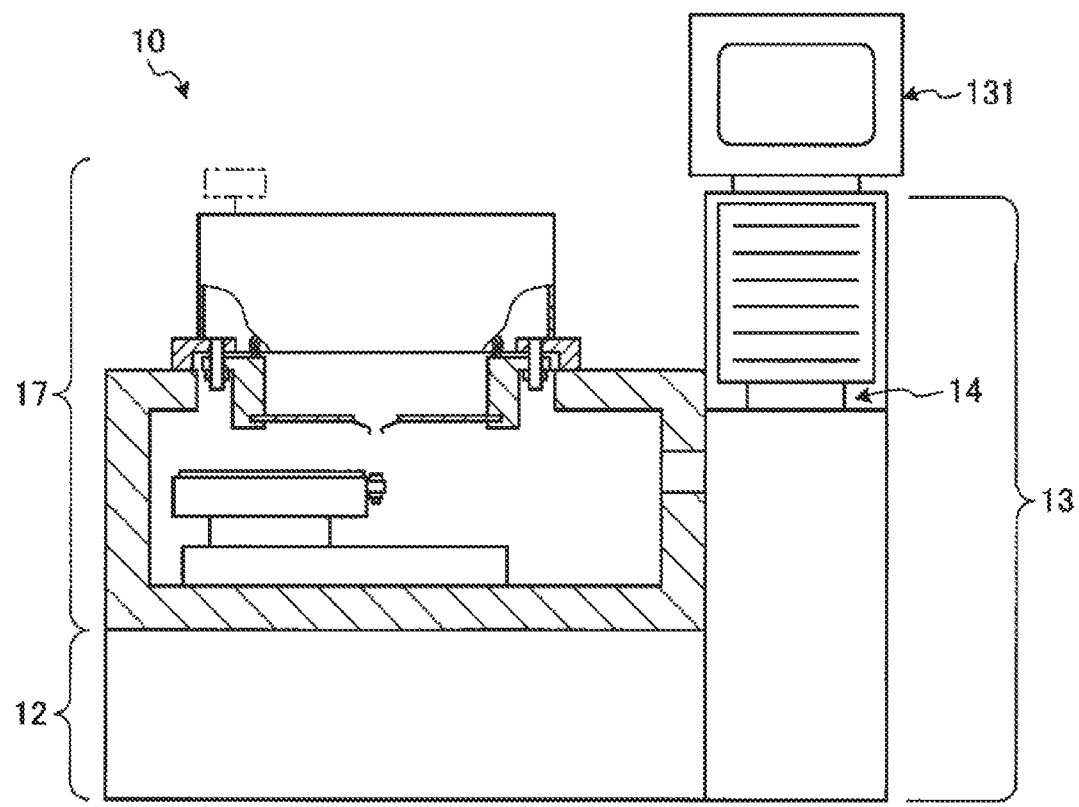
FIG. 2 is a view illustrating an example of an inspection apparatus according to an embodiment of the present disclosure.

FIG. 2 is a view illustrating an example of the inspection apparatus 10 according to an embodiment of the present disclosure. The inspection apparatus 10 includes a control unit 12, a loader unit 13, an inspection unit 17, and a display device 131. The inspection apparatus 10 transfers a semiconductor wafer (hereinafter referred to as "wafer W"), which is an inspection object, from the loader unit 13 to the inspection unit 17 under the control of the control unit 12. The inspection apparatus 10 applies an electrical signal to a device under test (DUT) formed on the wafer W and inspects various electrical characteristics of the DUT.

The loader unit 13 includes a cassette accommodation part 14 and a wafer transfer mechanism (not illustrated). The cassette accommodation part 14 accommodates a cassette C in which the wafers W are accommodated. The cassette C may be a front opening unified pod (FOUP). The wafer transfer mechanism transfers the wafer W between the cassette C accommodated in the cassette accommodation part 14 and a stage 179 provided in the inspection unit 17 to be described later.

[Configuration of Inspection Unit 17]

Figure 3:
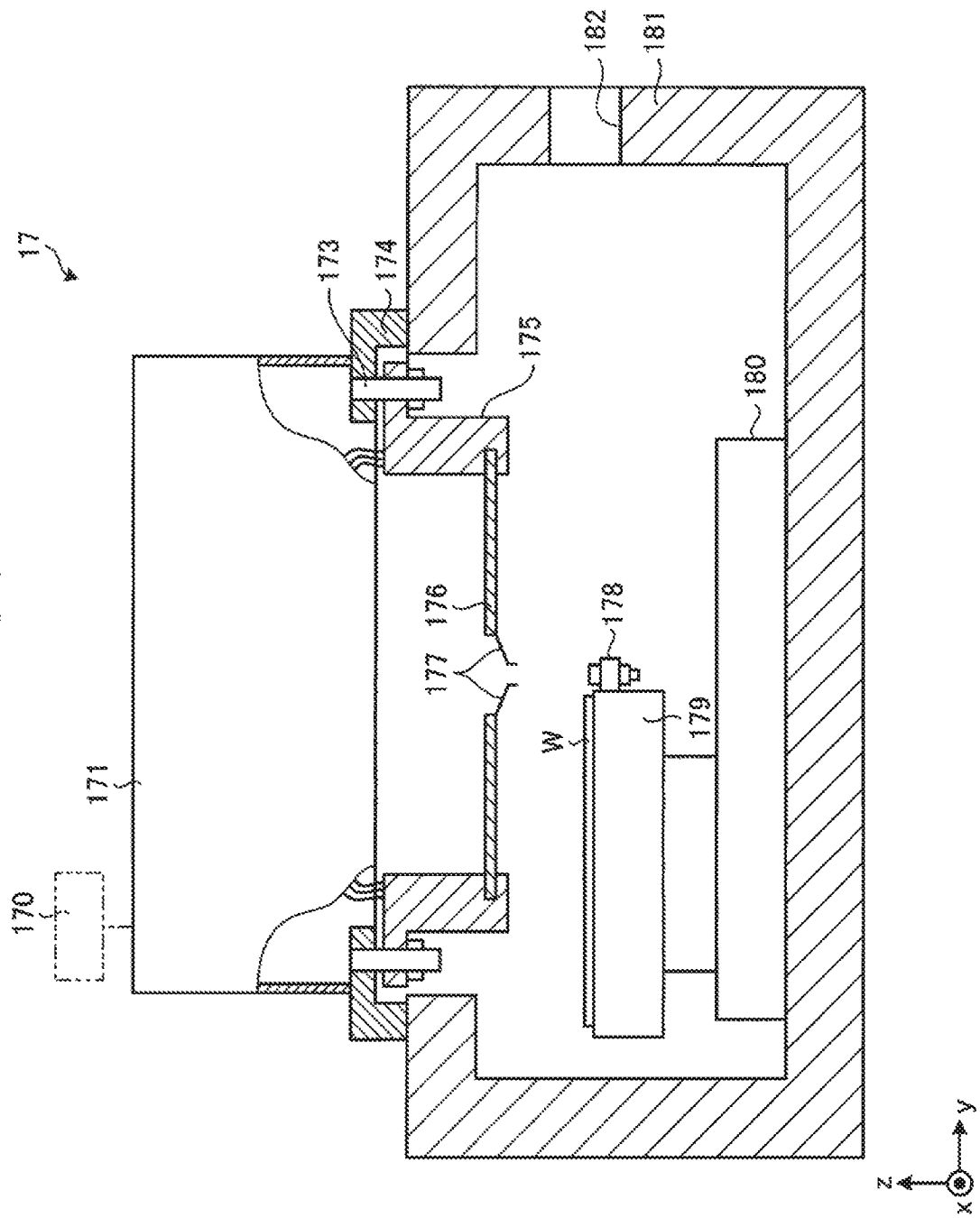
FIG. 3 is a schematic cross-sectional view illustrating an example of an inspection unit according to an embodiment of the present disclosure.

FIG. 3 is a schematic cross-sectional view illustrating an example of the inspection unit 17 according to an embodiment of the present disclosure. The inspection unit 17 includes a hollow housing 181. An opening 182 for loading and unloading the wafer W therethrough is formed in a sidewall of the housing 181. A moving mechanism 180 is provided in a substantial inner center of the housing 181 to move the stage 179 in a vertical direction (z-axis direction in FIG. 3) and in a transverse direction (a direction in an x-y plane parallel to an x-axis and a y-axis in FIG. 3). The wafer W is placed on an upper surface of the stage 179. The stage 179 attractively holds the wafer W placed on the upper surface thereof using a vacuum chuck or the like. A camera 178 is provided on a lateral surface of the stage 179. The camera 178 is attached to the lateral surface of the stage 179 such that an imaging direction thereof is oriented upwards.

As the stage 179 moves by the moving mechanism 180, the camera 178 provided on the lateral surface of the stage 179 is also moved. The moving mechanism 180 is controlled by the control unit 12. A movement amount of the moving mechanism 180 is managed by the control unit 12, Accordingly, the control unit 12 manages the x-coordinate, y-coordinate, and z-coordinate of the position of each of the camera 178 and the stage 179 inside the housing 181.

The housing 181 has a substantially circular opening formed in an upper portion thereof. A test head 171 is provided in the opening. The test head 171 is fixed to a frame 174 provided along a peripheral edge of the opening. The frame 174 supports a substantially cylindrical holder 175 from above via a shaft 173.

The holder 175 detachably holds, in a lower portion thereof, a probe card 176 provided with a plurality of probe needles 177. Each of the probe needles 177 provided on the probe card 176 is located such that the tip thereof is oriented downwards. Although cantilever type of probe needles 177 have been illustrated to be provided in the probe card 176 as shown in FIG. 3, vertical needle type of probe needles 177 may be provided in the probe card 176. Alternatively, both the cantilever type of probe needles 177 and the vertical needle type of probe needles 177 may be provided in the probe card 176.

In this embodiment, the probe card 176 can be used in each of the inspection units 17 of the plurality of different inspection apparatuses 10A, 10B, and 10C. For example, when the maintenance of the probe card 176 attached to the inspection 7 corresponding to the inspection apparatus 10A becomes necessary, the respective probe card 176 is removed, and another probe card 176 may be attached to the respective inspection unit 17 of the inspection apparatus 10A. Then, the probe card 176 for which the maintenance has been completed may be attached to the inspection unit 17 of the inspection apparatus 10B or 10C.

In addition, each of the probe needles 177 is disposed on the probe card 176 such that, when the wafer W placed on the stage 179 moves to an inspection position, each of the probe needles 177 is located at a position at which the tip thereof comes into contact with a test pad provided on the wafer W. Each of the probe needles 177 is connected to each wire provided on the probe card 176. The wires provided on the probe card 176 are coupled to the test head 171 via respective wires provided on the holder 175. An external tester 170 is connected to the test head 171.

In the inspection unit 17 configured as described above, when the inspection of the wafer W placed on the stage 179 is performed, first, the control unit 12 controls the moving mechanism 180 such that the camera 178 is positioned below the probe needles 177. Then, the control unit 12 controls the moving mechanism 180 such that the camera 178 captures images of the probe needles 177 while approaching the probe needles 177. Thereafter, the control unit 12 measures positions of the tip of each probe needle

177 in the horizontal direction and the vertical direction based on the images captured by the camera 178.

Subsequently, the control unit 12 controls the moving mechanism 180 to move the stage 179 upward on which the wafer W is placed, so that respective test pads of the wafer W and the probe needles 177 are brought into contact with each other with a predetermined amount of overdrive. The predetermined amount of overdrive refers to an amount by which the stage 179, on which the wafer W is placed, is moved upward, the test pads of the water W are brought into contact with the tips of the respective probe needles 177, and subsequently, the stage 179 is further moved upward. Hereinafter, the number of times of contact of the tip of each probe needle 177 with the respective test pad will be referred to as a contact number.

Subsequently, the control unit 12 controls the external tester 170 to output a predetermined electrical signal to the test head 171. The test head 171 outputs the electrical signal provided from the external tester 170, to the probe card 176 via each wire of the holder 175. The electrical signal provided to the probe card 176 is supplied to each probe needle 177 via each wire of the probe card 176, and is outputted to each test pad of the wafer W via each probe needle 177.

In addition, the electrical signal outputted from each test pad of the wafer W, is outputted to the probe needle 177. The electrical signal outputted to the probe needle 177 is outputted to the test head 171 via each wire of the probe card 176 and each wire of the holder 175. The electrical signal outputted to the test head 171 is outputted to the external tester 170. The external tester 170 evaluates the electrical characteristics of the wafer W based on the electrical signal outputted to the test head 171 and the electrical signal outputted from the test head 171, and outputs the evaluation result to the control unit 12.

When performing an alignment between the probe needles 177 and the water W, the control unit 12 specifies the states of the tip of each probe needle 177, such as the position and the size of the tip, based on the images captured by the camera 178. Then, the control unit 12 transmits information indicating the specified states of the tips to the management apparatus 20. In addition, the control unit 12 displays the information (hereinafter, referred to as card information) on the probe card 176, which is provided from the management apparatus 20, on the display device to be described later. The card information includes a contact number measured thus far, a contact number until maintenance is required, a contact number until the lifespan expires, and the like.

Here, as the inspection of the wafers W is repeated, the states of the tips of the probe needles 177 change. Examples of the change in the states of the tips of the probe needles 177 may include the wear or bending of the tips, the loss or stacking of the probe needles 177, and the adhesion of foreign matter to the tips. The wear or bending of the tips, and the loss or stacking of the probe needles 177 may be evaluated based on, for example, differences between measured positions and designed positions of the tips. In addition, the wear of the tips and the adhesion of foreign matter to the tips may be evaluated based on, for example, differences between measured sizes of the tips and designed sizes of the tips. Such changes in the tips of the probe needles 177 may be somewhat recovered by performing maintenance such as polishing of the tips. However, the tips of the probe needles 177 may further change due to the polishing itself, and thus, it is difficult to completely recover the tips by the maintenance. The maintenance of the probe card 176 is executed by a maintenance apparatus (not illustrated).

[Configuration of Control Unit 12]

Figure 4:
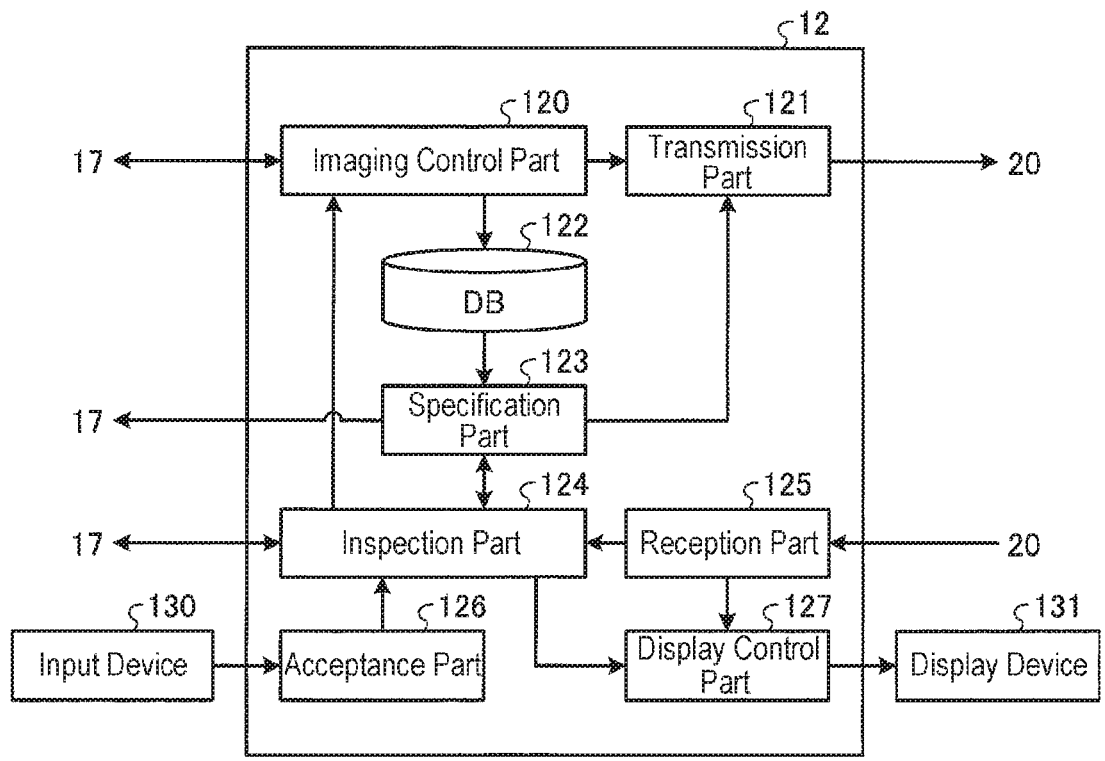
FIG. 4 is a block diagram illustrating an example of a control unit according to an embodiment of the present disclosure.

FIG. 4 is a block diagram illustrating an example of the control unit 12 according to an embodiment of the present disclosure. The control unit 12 includes an imaging control part 120, a transmission part 121, a database (DB) 122, a specification part 123, an inspection part 124, a reception part 125, an acceptance part 126, and a display control part 127.

When the start of inspection is instructed from the outside (e.g., a users via an input device 130 such as a touch panel, the acceptance part 126 instructs the inspection part 124 to start the inspection. In addition, the acceptance part 126 accepts the number of wafers W to be inspected via the input device 130, and outputs the accepted number of wafers W to the inspection part 124.

The transmission part 121 transmits the data, outputted from the imaging control part 120 and the specification part 123 to the management apparatus 20 via a wired line or a wireless line.

When the probe card 176 is attached to the holder 175 of the inspection unit 17, the imaging control part 120 controls the moving mechanism 180 to move the stage 179 such that a portion of the probe card 176 on which a card ID is written is captured by the camera 178. The card ID is the information for identifying each probe card 176. A sticker having a card ID written thereon or the like is attached to the probe card 176. In addition, the card ID of the probe card 176 may be directly printed on the probe card 176. The card ID of the probe card 176 may be written in a format other than letters, numbers, or symbols, such as a barcode. Then, the imaging control part 120 causes the camera 178 to image the card ID of the probe card 176 and transmits the card ID imaged by the camera 178 to the management apparatus 20 via the transmission part 121.

In addition, the imaging control part 120 controls the moving mechanism 180 to move the stage 179 such that the camera 178 is positioned below the probe needles 177. Then, the imaging control part 120 causes the camera 178 to capture each probe needle 177, and acquires an image captured by the camera 178. The acquired image is stored in the DB 122 in association with the card ID of the probe card 176. The DB 122 stores each image captured by the camera 178 in association with the x coordinate and the v coordinate of the camera 178.

In addition, when accurately specifying the z coordinate of the probe needle 177, the imaging control part 120 switches the camera 178 to a high-resolution optical system having a short (shallow) depth of field. Then, the imaging control part 120 controls the moving mechanism 180 to move the stage 179 such that the camera 178 is positioned below the probe needles 177, and subsequently, moves the stage 179 upward. As a result, the camera 178 moves upward together with the stage 179 and moves along a height direction of each probe needle 177, namely in the z-axis direction in FIG. 3. Then, the imaging control part 120 causes the camera 178 to image the tips of the plurality of probe needles 177 at each position of the moving camera 178 such that the tips of the plurality of probe needles 177 are captured in one image.

Subsequently, the imaging control part 120 stores each image captured by the camera 178 in the transmission part 121 in association with the z coordinate of the focused plane. In this embodiment, the imaging control part 120 has a preset object distance from a lens of the camera 178 to the focused plane. In each image, the imaging control part 120 specifies the z coordinate of the focused plane based on the object distance and a position coordinate of the lens of the camera 178 when the respective image is captured.

Figure 5:
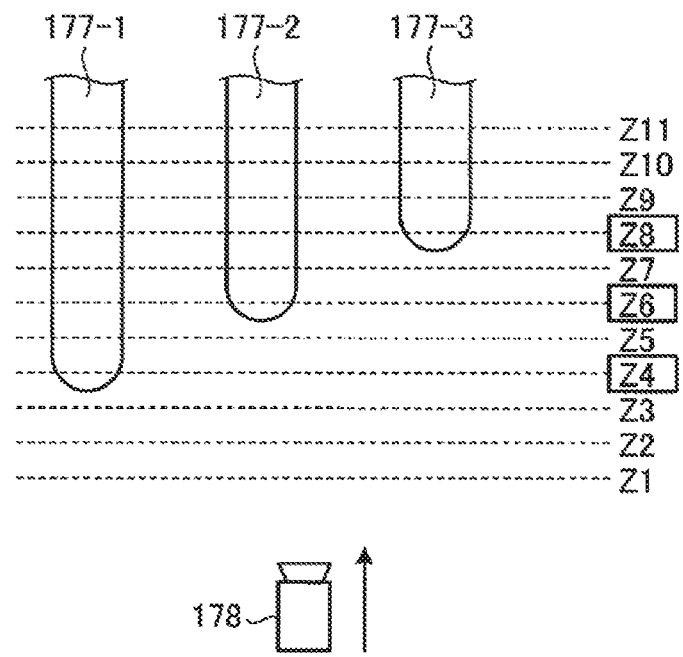
FIG. 5 is a view illustrating an example of the relationship between a movement direction of a camera and a position of a focused plane.

FIG. 5 is a view illustrating an example of the relationship between the movement direction of the camera 178 and the position of the focused plane. The imaging control part 120 controls the moving mechanism 180 to move the camera 178 so as to move up from below the probe needles 177, for example, as indicated by an arrow in FIG. 5. Subsequently, the imaging control part 120 causes the camera 178 to capture the tips of the plurality of probe needles 177 at each position of the moving camera 178 such that the tips of the plurality of probe needles 177 are captured in one image. In the example of FIG. 5, tips of three probe needles 177-1 to 177-3 are captured in one image captured by the camera 178. As the camera 178 moves upward, for example, the z coordinate of the focused plane of the camera 178 changes from Z1 to Z11, as illustrated in FIG. 5.

Figure 6:
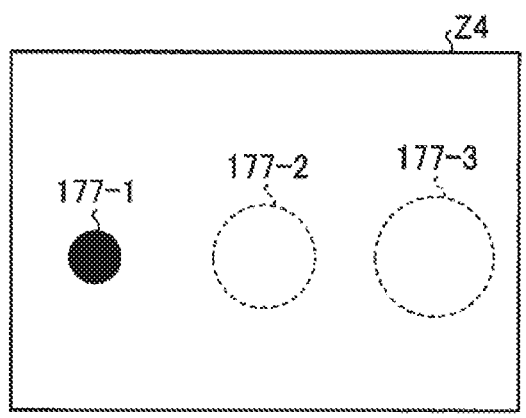
FIG. 6 is a view illustrating examples of images captured by a camera.
Figure 6:
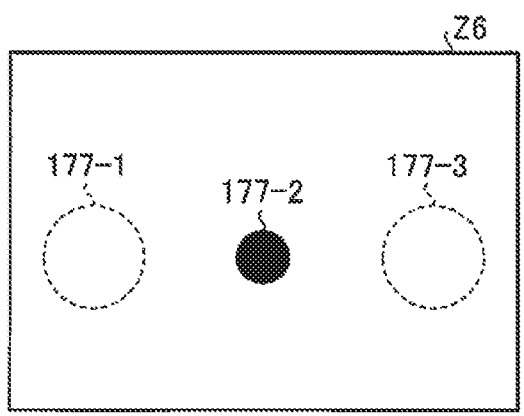
Figure 6:
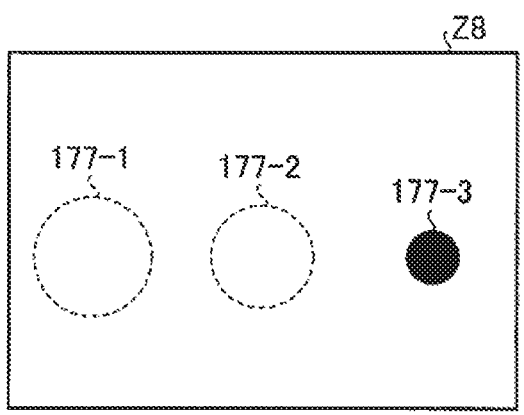

In the following description, an image associated with Zn (n is an integer from 1 to 11) that is the z coordinate of the focused plane of the camera 178 will be referred to as an image Zn. In the example of FIG. 5, the tip of the probe needle 177-1 is focused on an image Z4, the tip of the probe needle 177-2 is focused on an image Z6, and the tip of the probe needle 177-3 is focused on an image Z8. For example, the images Z4, Z6, and Z8 captured by the camera 178 are as shown in FIG. 6. In this manner, it is possible to specify the z coordinate of each probe needle 177 in association with the z coordinate of the camera 178 that is focused on the tip of each probe needle 177. In addition, since the camera 178 is switched to a high-resolution optical system having a short (shallow) depth of field, the range of an in-focus distance becomes narrower, which makes it possible to detect the position of the tip of each probe needle 177 in the z-axis direction with high accuracy.

The specification part 123 refers to the DB 122 and specifies the state of the tip of each probe needle 177 based on the images captured by the camera 178 at each position of the camera 178. The specification part 123 outputs measurement information including information indicating the specified state of each tip to the transmission part 121. The information indicating the specified state of each tip includes a measurement result for each tip measurement item. Examples of the tip measurement items may include items such as the x coordinate of each tip, the y coordinate of each tip, the z coordinate of each tip, the width of each tip in the x-axis direction, the width of each tip in the y-axis direction, and the like. In addition, the measurement information includes the card ID of the probe card 176, an apparatus ID of the inspection unit 17 to which the probe card 176 is attached, and the contact number outputted from the inspection part 124.

The specification part 123 specifies the size of the tip of each probe needle 177 based on the detected image. The specification part 123 transmits, through the transmission part 121, the measurement information including information indicating the state of each tip, the card ID of the probe card 176, and the apparatus ID of the inspection unit 17 on which the probe card 176 is attached, to the management apparatus 20. The information indicating the state of each tip includes information regarding the specified position and size of the tip of each probe needle 177.

When receiving the card information of the probe card 176 from the management apparatus 20, the reception part 125 outputs the received card information of the probe card 176 to the inspection part 124 and the display control part 127. The card information includes information such as a cumulative contact number that is estimated as the cumulative number of contacts until the maintenance of the probe card 176 is required, a cumulative number of contacts that is estimated as the cumulative number of contacts until the lifespan of the probe card 176 expires, and the like. In the following description, the cumulative contact number that is estimated as the cumulative number of contacts until the maintenance of the probe card 176 is required will be referred to as a maintenance-scheduled contact number. In addition, the cumulative contact number that is estimated as the cumulative number of contacts until the lifespan of the probe card 176 expires will be referred to as a lifespan-expired cumulative contact number.

When the instruction start is instructed from the acceptance part 126, the inspection part 124 controls the moving mechanism 180 to move the stage 179, on which the wafer W is placed, below the probe needle 177. Subsequently, the inspection part 124 moves the stage 179 upward such that the test pads of the wafer W and the tips of the probe needles 177 come into contact with each other. Then, the inspection part 124 instructs the external tester 170 to start inspection, and starts the inspection of the wafer W. The inspection part 124 offsets the position of the wafer W in the x-y plane at the time of inspection based on the positional information in the x-y plane outputted from the specification part 123. As a result, the tip of each probe needle 177 can be reliably brought into contact with the respective test pad.

In addition, the inspection part 124 counts a contact number of the tip of each probe needle 177 with the respective test pad, and outputs the counted contact number to the specification part 123. Then, with reference to the card information outputted from the reception part 125, when the total of the counted contact number and the cumulative contact number reaches the maintenance-scheduled contact number, the inspection part 124 instructs the display control part 127 to issue an alarm. In addition, when the total of the counted contact number and the cumulative contact number reaches the lifespan-expired cumulative contact number, the inspection part 124 interrupts the inspection and instructs the display control part 127 to issue an error.

Figure 7:
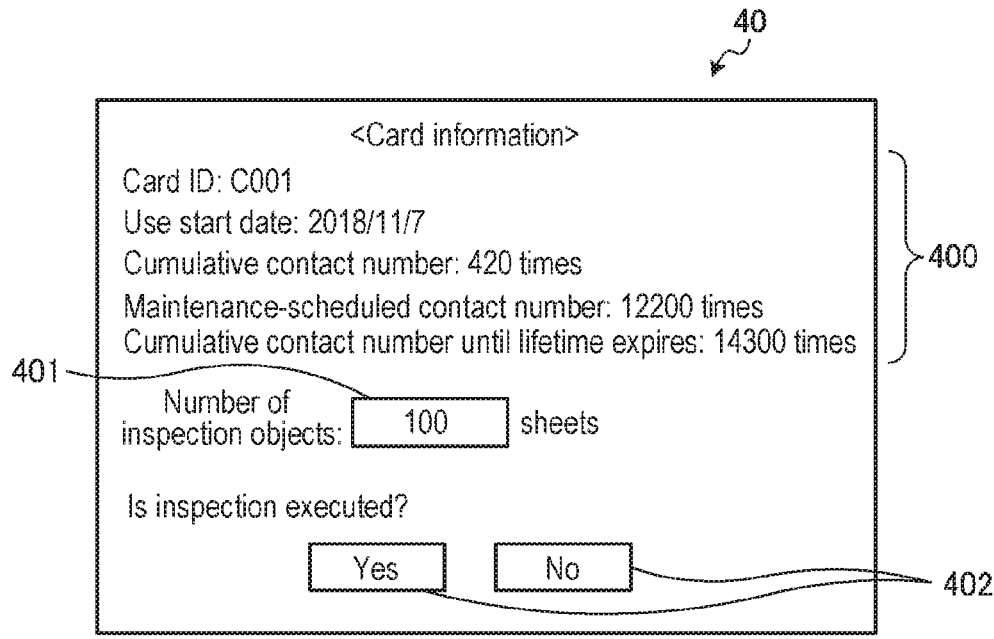
FIG. 7 is a view illustrating an example of an image displayed on a display device.

When the information of the probe card 176 is outputted from the reception part 125, the display control part 127 causes, for example, an image 40 as shown in FIG. 7 to be displayed on the display device 131. FIG. 7 is a view illustrating an example of the image 40 displayed on the display device 131.

As shown in FIG. 7, for example, the image 40 includes an area 400 in which the card information related to the probe card 176 is displayed. For example, the card ID, the use start date, the cumulative contact number, the maintenance-scheduled contact number, and the lifespan-expired cumulative contact number, of the probe card 176 attached to the inspection unit 17 are included in the area 400 as the card information. In addition, the image 40 includes an input box 401 for inputting the number of wafers W to be inspected, and selection buttons 402.

The image 40 exemplified in FIG. 7 is displayed on the display device 131 before the inspection of the wafer W is begun after the probe card 176 is attached to the inspection unit 17. The user inputs the number of wafers W to be inspected in the input box 401 and selects the selection button 402 of "Yes" in order to instruct the inspection apparatus 10 to execute the inspection of the wafers W. Meanwhile, when the selection button 402 of "No" is selected, the execution of the inspection of the wafers W is canceled.

By referring to the card information included in the image 40, it is possible for the user to determine whether or not the probe card 176 to be used hereafter is a card, of which the maintenance period or the lifespan is approaching. By referring to the card information, it is possible for the user to designate the number of wafers W to be inspected within a range in which replacement is not required during the inspection. By referring to the card information, the user is able to avoid interruption of inspection due to the fact that the probe card 176 needs to be replaced during the inspection, before starting the inspection.

In addition, when an alarm notification is instructed from the inspection part 124, the display control part 127 displays an alarm on the display device 131. In addition, when an error notification is instructed from the inspection part 124, the display control part 127 displays an error on the display device 131.

[Configuration of Management Apparatus 20]

Figure 8:
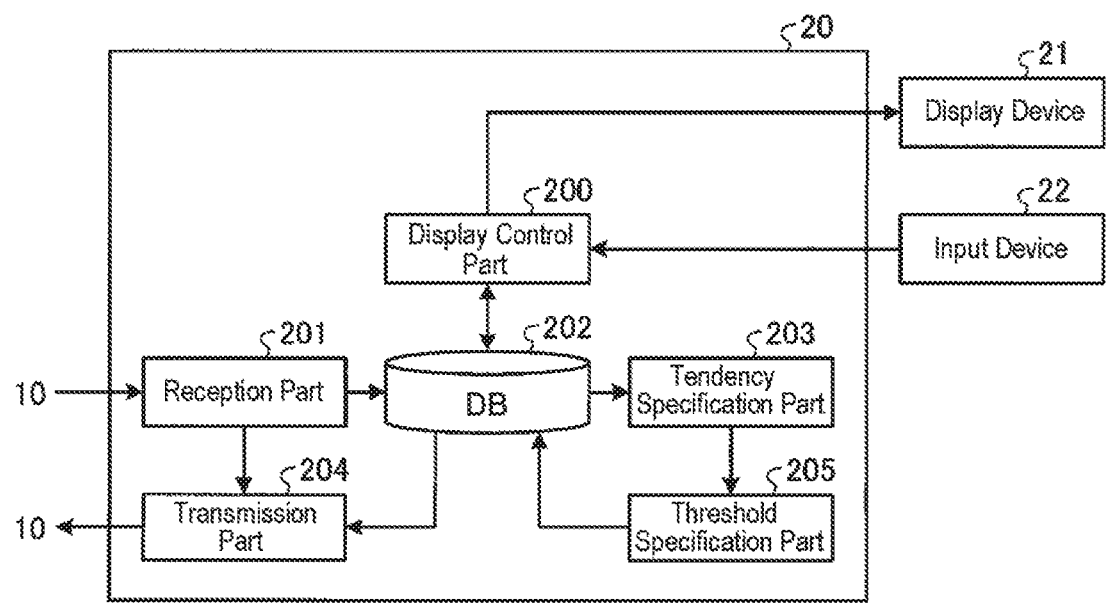
FIG. 8 is a block diagram illustrating an example of a management apparatus according to an embodiment of the present disclosure.

FIG. 8 is a block diagram illustrating an example of the management apparatus 20 according to an embodiment of the present disclosure. The management apparatus 20 includes a display control part 200, a reception part 201, a DB 202, a tendency specification part 203, a transmission part 204, and a threshold specification part 205. The display control part 200 is an example of a data management part.

Figures 9, 10:
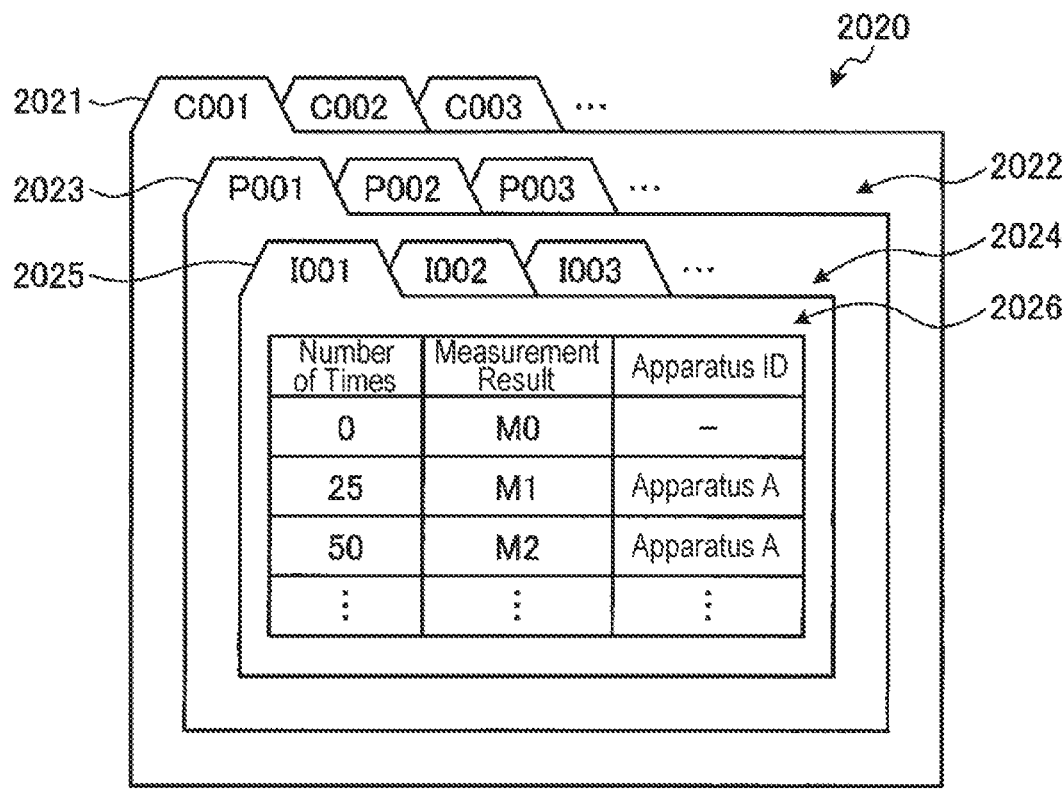
FIG. 9 is a view illustrating an example of a measurement history table.
FIG. 10 is a view illustrating an example of a cumulative contact number table.

For example, the DB 202, which is an example of a storing part, stores a measurement history table 2020 shown in FIG. 9, and a cumulative contact number table 2028 shown in FIG. 10, FIG. 9 is a view illustrating an example of the measurement history table 2020. The measurement history table 2020 stores card tables 2022 in association with card IDs 2021 for identifying respective probe cards 176. The card table 2022 stores needle tables 2024 in association with needle IDs 2023 for identifying respective probe needles 177. The needle table 2024 stores measurement result tables 2026 in association with item IDs 2025 for identifying the measurement items of the tips of the probe needles 177.

Each of the measurement result tables 2026 stores the measurement results of tips after the contact number has been executed and the apparatus ID of the inspection unit 17 in which the contact number has been executed, in association with the contact number. The values measured by the control unit 12 are stored in the section of the measurement result. However, in "M0" stored in the section of the measurement result, for example, a design value is stored in advance. When maintenance has been performed, information indicating that the maintenance has been performed is stored, and data other than the section in which the contact number is "0" is deleted. However, the information in the measurement history table 2020 before maintenance may be stored in a separate location in the DB 202, and may be referred to as necessary.

FIG. 10 is a view illustrating an example of the cumulative contact number table 2028. The cumulative contact number table 2028 stores cumulative contact numbers, first thresholds, and second thresholds in association with the card IDs of the probe cards 176. Each first threshold is the lifespan-expired cumulative contact number. Each second threshold is the maintenance-scheduled contact number. Further, information such as a use start date for each card ID may be stored in the cumulative contact number table 2028.

When receiving a card ID from the inspection apparatus 10 via a wired line or a wireless line, the reception part 201 outputs the card ID to the transmission part 204. In addition, the reception part 201 receives measurement information including a card ID, a measurement result for each item indicating the state of each tip, an apparatus ID, and a contact number from the inspection apparatus 10 via a wired line or a wireless line. The reception part 201 stores the received measurement result for each item and the contact number in the measurement history table 2020 in association with the card ID and the needle ID. Then, the reception part 201 outputs the card ID to the transmission part 204.

The tendency specification part 203 refers to the DB 202 and specifies the tendency of changes in measurement results with respect to the contact number for each probe card 176 based on the measurement results and the contact number of each probe needle 177. The threshold specification part 205 specifies the first threshold and the second threshold for each probe card 176 based on the change tendency specified by the tendency specification part 203.

Figure 11:
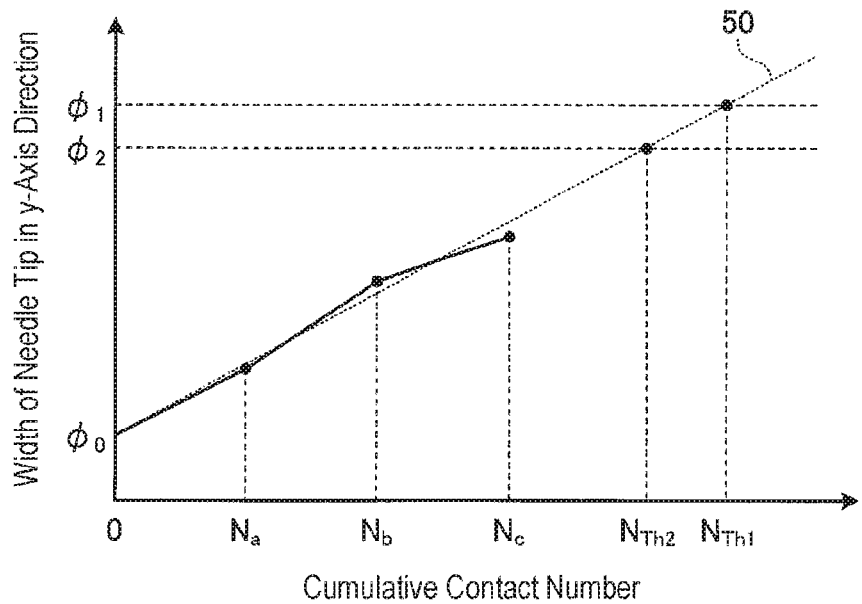
FIG. 11 is a view for explaining an example of a method of estimating a first threshold and a second threshold.

FIG. 11 is a graph for explaining an example of a method of estimating the first and second thresholds. In the example of FIG. 11, the measurement result of the width of a tip in the y-axis direction is represented as an example of the measurement result of a certain probe needle 177 of a certain probe card 176. Here, a threshold $\varphi_1$ is the width of the tip in the y-axis direction when it is determined that a preset lifespan of the probe needle 177 expires, and a threshold $\varphi_2$ is the width of the tip in the y-axis direction when it is determined that a preset maintenance of the probe needle 177 is necessary. In FIG. 11, from "0" to "$N_a$" in the cumulative contact number, the measurement results were obtained by performing the inspection in the state in which a probe card was attached to a certain inspection unit 17a. In addition, from "$N_a$" to "$N_b$" in the cumulative contact number, the measurement results were obtained by performing the inspection in the state in which the probe card was attached to an inspection unit 17b different from the inspection unit 17a. Furthermore, from "$N_b$" to "$N_c$" in the cumulative contact number, the measurement results were obtained by performing the inspection in the state in which the probe card was attached to another inspection unit 17c different from the inspection unit 17a and the inspection unit 17b.

The tendency specification part 203 specifies, for example, a straight line 50 that approximates the changes in the measurement results as a change tendency of the measurement results with respect to the cumulative contact number. In some embodiments, the tendency specification part 203 may specify, for example, a curve that approximates the changes in the measurement results as a change tendency of the measurement results with respect to the cumulative contact number.

The threshold specification part 205 specifies the first threshold $N_{Th1}$ that is the lifespan-expired cumulative contact number based on the straight line 50 specified by the tendency specification part 203, the measurement result of the probe needle 177, and the threshold $\varphi_1$. Similarly, the threshold specification part 205 specifies the second threshold $N_{Th2}$ that is the maintenance-scheduled contact number based on the straight line 50 specified by the tendency specification part 203, the measurement result of the probe needle 177, and the threshold $\varphi_2$.

Further, the threshold specification part 205 updates, for each probe card 176, the first threshold, the second threshold and the cumulative contact number in the cumulative contact number table 2028 with the specified first threshold, the specified second threshold, and the latest cumulative contact number.

When a card ID is outputted from the reception part 201, the transmission part 204 creates card information with reference to the measurement history table 2020 and the cumulative contact number table 2028 in the DB 202. Then, the reception part 201 transmits the created card information to the inspection apparatus 10 via a wired or wireless line. The card information transmitted to the inspection apparatus 10 is displayed on the display device 131 connected to the control unit 12 so that the outside (for example, the user) of the inspection apparatus 10 is notified of the card information. As a result, the transmission part 204 can notify the outside of the inspection apparatus 10 of the number of executions of the inspection and the first threshold for each probe card 176. The transmission part 204 is an example of a notification part.

Figure 12:
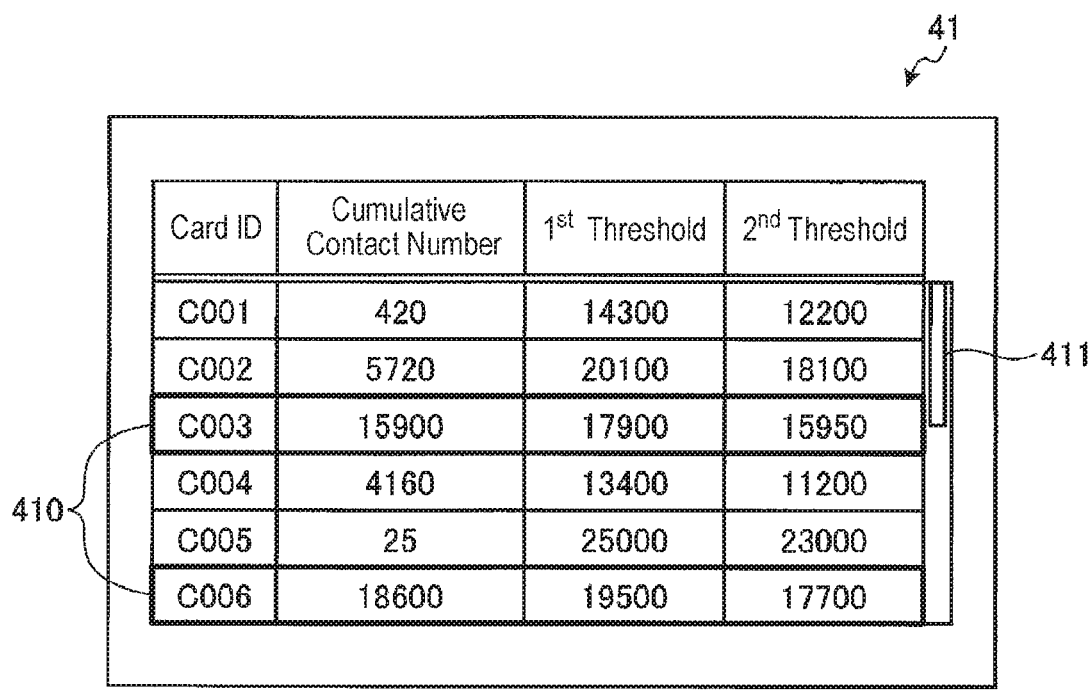
FIG. 12 is a view illustrating an example of an image displayed on a display device.

When a card information display instruction is received from the user of the management apparatus 20 via the input device 22 such as a touch panel, the display control part 200 creates an image 41 as illustrated in FIG. 12 with reference to the cumulative contact number table 2028 in the DB 202. Then, the display control part 200 causes the created image 41 to be displayed on the display device 21. FIG. 12 is a view illustrating an example of the image 41 displayed on the display device 21. In the image 41, information in the cumulative contact number table 2028 is described. The user is able to confirm the state of the probe card 176 corresponding to each card ID by operating a slider 411 in the image 41 via the input device 22.

In the present embodiment, the display control part 200 highlights, in the image 41, information associated with the cumulative contact number, which differs from the first threshold by a first numberless (e.g., 1000 times or less). In the example of FIG. 12, the information having a card ID "C006" associated with the cumulative contact number which differs from the first threshold by 900 is highlighted in a frame 410. In some embodiments, by highlighting the first threshold associated with the cumulative contact number which differs from the first threshold by the first number or less, the outside (e.g., the user) may be notified that the cumulative contact number will soon reach the first threshold.

In addition, the display control part 200 may highlight, in the image 41, information associated with the cumulative contact number, which differs from the second threshold by a second number or less (e.g., 100 times or less). In the example of FIG. 12, the information having a card ID "C003" associated with the cumulative contact number which differs from the second threshold by 50 is highlighted in another frame 410. In some embodiments, by highlighting the second threshold associated with the cumulative contact number which differs from the second threshold by the second number or less, the user may be notified that the cumulative contact number will soon reach the second threshold.

In some embodiments, for information associated with the cumulative contact number which differs from the first threshold by a predetermined value or less, even when the card information display instruction is not received from the user of the management apparatus 20, the management apparatus 20 may notify a predetermined notification destination of the information. The predetermined notification destination may be an e-mail address of an administrator of the probe card management system 1, or the like.

In addition, when a notification that the maintenance has been performed is received from the user of the management apparatus 20 together with the card ID via the input device 22, the display control part 200 specifies the card table 2022 associated with the card ID in the measurement history table 2020 of the DB 202. Then, after storing the information stored in the measurement history table 2020 before the maintenance, in another location in the DB 202, the display control part 200 deletes all the data other than the section in which the contact number is "0" in the specified card table 2022. In addition, when a notification that the maintenance has been performed is received from the user of the management apparatus 20 together with the card ID, the display control part 200 resets the cumulative contact number associated with the card ID to zero in the measurement history table 2020 of the DB 202, When the cumulative contact number is reset to zero due to the maintenance, in order to indicate such a reset state, the display control part 200 may cause the cumulative contact number that is reset to zero, to be displayed on the display device 21 using, for example, a changed display color or the like. In addition, information in the measurement history table 2020 before maintenance, which is stored in another location in the DB 202, may be referred to as necessary.

[Process of Inspection Apparatus 10]

Figure 13:
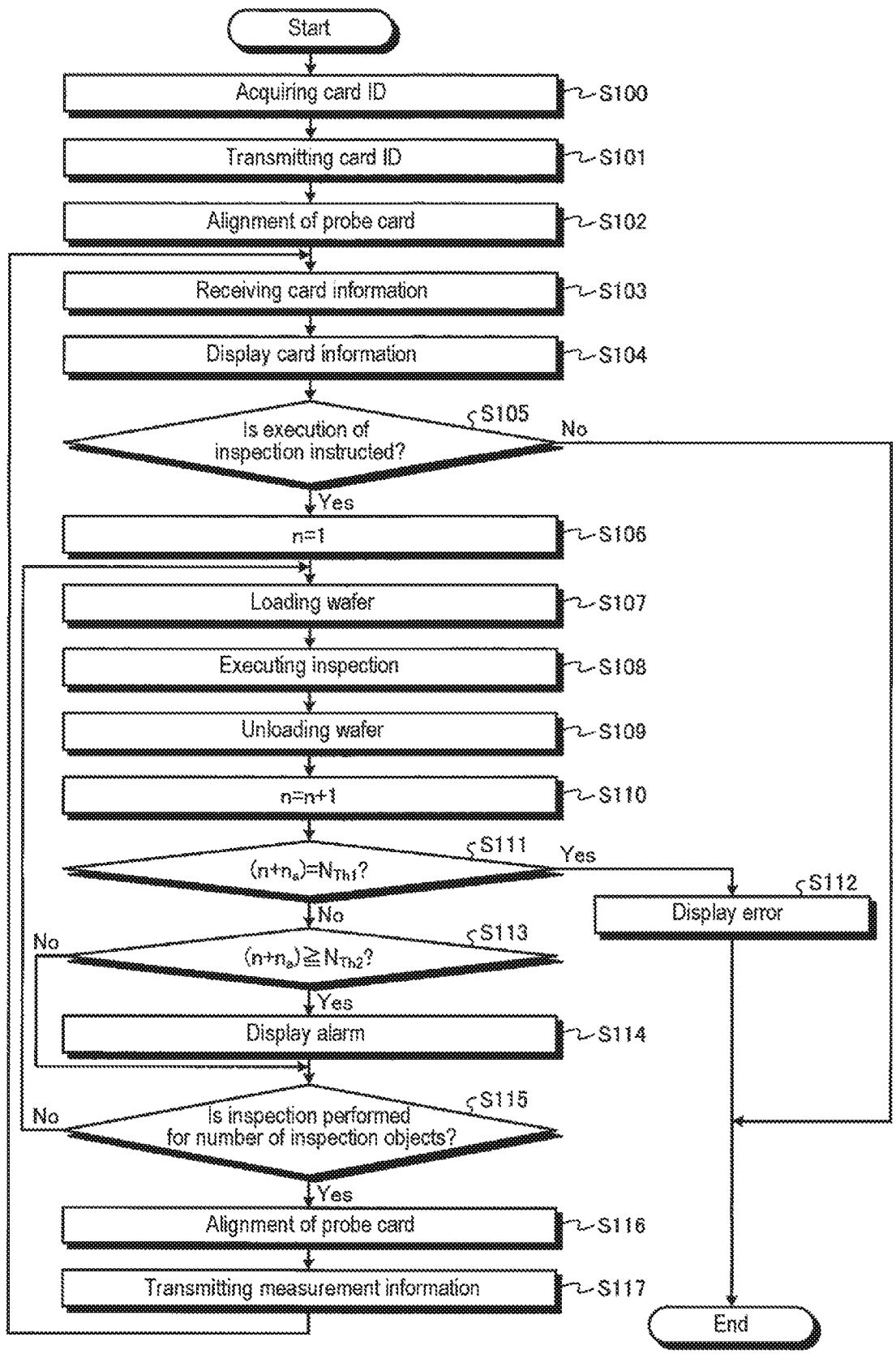
FIG. 13 is a flowchart illustrating an example of a process performed by the inspection apparatus.

FIG. 13 is a flowchart illustrating of an example of the process performed by the inspection apparatus 10. For example, when the probe card 176 is attached to the holder 175 of the inspection unit 17, the control unit 12 starts the process illustrated in this flowchart.

First, the imaging control part 120 of the control unit 12 acquires the card ID of the probe card 176 by causing the camera 178 to capture a portion of the probe card 176 on which the card ID is described (S100). Subsequently, the imaging control part 120 outputs the acquired card ID to the transmission part 121. The transmission part 121 transmits the card ID outputted from the imaging control part 120 to the management apparatus 20 (S101).

Subsequently, the control unit 12 performs alignment of the probe card 176 (S102). In the alignment of the probe card 176, first, the imaging control part 120 controls the moving mechanism 180 to move the stage 179 such that the camera 178 is positioned below the probe needles 177. Thereafter, the imaging control part 120 causes the camera 178 to capture each probe needle 177, and acquires images captured by the camera 178. The acquired images are stored in the DB 122 in association with the card ID of the probe card 176.

The specification part 123 refers to the DB 122 and specifies the position, size and the like of the tip of each probe needle 177 based on the images captured by the camera 178 at each position of the camera 178.

Subsequently, the reception part 125 receives card information from the management apparatus 20 (S103), Thereafter, the reception part 125 outputs the received card information to the inspection part 124 and the display control part 127. The display control part 127 causes the card information to be displayed on the display device 131 (S104). In step S104, for example, the image 40 exemplified in FIG. 7 is displayed on the display device 131.

Subsequently, the inspection part 124 determines whether or not the execution of the inspection is instructed via the input device 130 and the acceptance part 126 (S105). If it is determined that the execution of the inspection is not instructed (S105: "No"), namely when the selection button 402 indicating "No" is selected in the image 40 exemplified in FIG. 7, the control unit 12 completes the process illustrated in this flowchart.

Meanwhile, if it is determined that the execution of the inspection is instructed (S105: "Yes"), the inspection part 124 initializes a variable n for counting the contact number to 1 (S106). When the execution of the inspection is instructed, in the image 40 exemplified in FIG. 7, the number of inspection objects is inputted to the input box 401, and the selection button 402 indicating "Yes" is selected.

The inspection part 124 controls a transfer mechanism or the like to load the wafer W to be inspected into the housing 181 of the inspection unit 17, and to place the wafer W on the stage 179 (S107). Thereafter, the inspection part 124 controls the moving mechanism 180 to finely adjust the position of the wafer W, and then brings the tip of each probe needle 177 into contact with the respective test pad to thereby execute the inspection of the wafer W (S108). Thereafter, the inspection part 124 controls the transfer mechanism or the like to unload the inspected wafer W from the housing 181 (S109).

Subsequently, the inspection part 124 increments the variable n by 1 (S110). Thereafter, the inspection part 124 determines whether the total value of the variable n and the cumulative contact number $n_a$ in the card information displayed on the display device 131 in step S104 reaches the first threshold $N_{Th1}$ (S111). If it is determined that the total value of the variable n and the cumulative contact number $n_a$ reaches the first threshold $N_{Th1}$ (S111: "Yes"), the inspection part 124 interrupts the inspection and instructs the display control part 127 to issue an error notification. The display control part 127 displays an error indicating that the probe card 176 needs to be replaced on the display device 131 (S112). Thereafter, the control unit 12 completes the process illustrated in this flowchart. This makes it possible to prevent the inspection of the wafer W from being executed using a probe card 176, of which the lifespan has expired.

Meanwhile, if it is determined that the total value of the variable n and the cumulative contact number $n_a$ does not reach the first threshold $N_{Th1}$ (S111: "No"), the inspection part 124 determines whether or not the total value of the variable n and the cumulative contact number $n_a$ is equal to or higher than the second threshold $N_{Th2}$ (S113), if it is determined that the total value of the variable n and the cumulative contact number $n_a$ is less than the second threshold $N_{Th2}$ (S113: "No"), the inspection part 124 executes the process illustrated in step S115. Meanwhile, if it is determined that the total value of the variable n and the cumulative contact number $n_a$ is equal to or higher than the second threshold $N_{Th2}$ (S113: "Yes"), the inspection part 124 instructs the display control part 127 to issue an alarm notification. The display control part 127 displays an alarm indicating that maintenance of the probe card 176 is necessary on the display device 131 (S114). This makes it possible to prompt the maintenance of the probe card 176 to the outside (e.g., the user).

Subsequently, the inspection part 124 determines whether or not inspection for the number of inspection objects, which is inputted in the input box 401 (see FIG. 7), has been executed (S115). If it is determined that the inspection for the number of inspection objects, which is inputted in the input box 401, has not been executed (S115: "No"), the inspection part 124 executes the process illustrated in step S107 again.

Meanwhile, if it is determined that the number of inspection objects, which is inputted in the input box 401, has been executed (S115: "Yes"), the inspection part 124 outputs the value of the variable n to the specification part 123. Thereafter, the control unit 12 performs alignment of the probe card 176 (S116). The alignment of the probe card 176 in step S116 is similar to the alignment of the probe card 176 in step S102, and thus a detailed description thereof is omitted.

Subsequently, the specification part 123 outputs measurement information including information indicating the state of the tip of each probe needle 177, the value of the variable n, the card ID of the probe card 176, and the apparatus ID of the inspection unit 17 to the transmission part 121. The information indicating the state of the tip of each probe needle 1 includes information such as the position and size of the tip of each probe needle 177 specified in the alignment of the probe card 176 in step S116. The variable n is a contact number that have been executed. The transmission part 121 transmits the measurement information, outputted from the specification part 123, to the management apparatus 20 (S117). Thus, it is possible for the management apparatus 20 to collect information such as the position and size of the tip of each probe needle 177 of the probe card 176 whenever the inspection is executed a predetermined number of times.

[Process of Management Apparatus 20]

Figure 14:
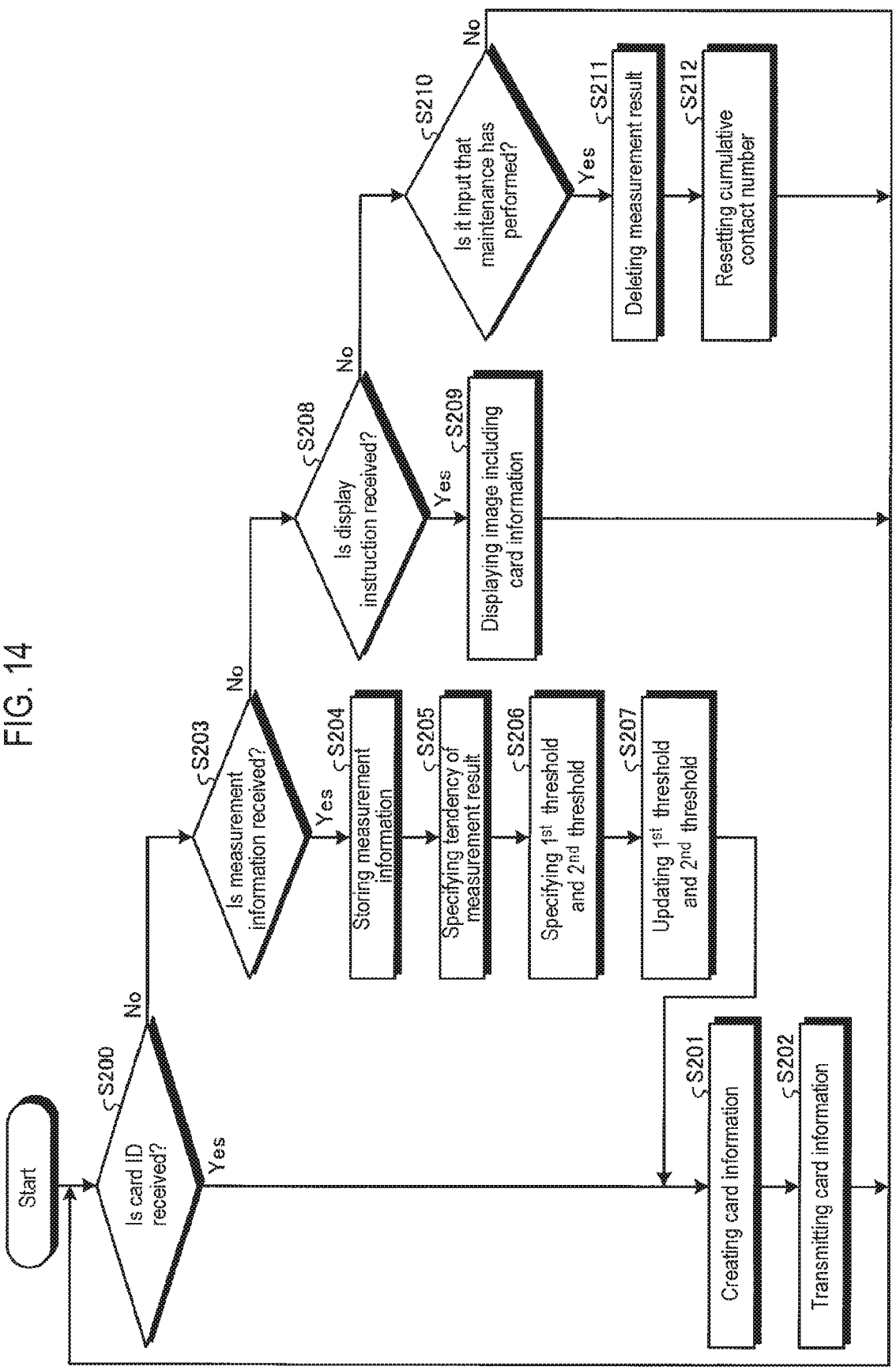
FIG. 14 is a flowchart illustrating an example of a process performed by the management apparatus.

FIG. 14 is a flowchart illustrating an example of the process performed by the management apparatus 20.

First, the reception part 201 determines whether or not a card ID is received from the inspection apparatus 10 (S200). If it is determined that the card ID is received (S200: "Yes" the reception part 201 outputs the received card ID to the transmission part 204. The transmission part 204 refers to the DB 202, collects information associated with the card ID outputted from the reception part 201, and creates card information (S201). Thereafter, the transmission part 204 transmits the created card information to the inspection apparatus 10 (S202). The process illustrated in step S200 is executed again.

If it is determined that the card ID is not received (S200: "No"), the reception part 201 determines whether or not measurement information is received from the inspection apparatus 10 (S203). If it is determined that the measurement information is received from the inspection apparatus 10 (S203: "Yes"), the reception part 201 stores, in the measurement history table 2020, the measurement results and the contact number for each item included in the received measurement information in association with the card ID and the needle ID (S204). In addition, the reception part 201 extracts the cumulative contact number associated with the card ID included in the measurement information from the cumulative contact number table 2028, and sums the extracted cumulative contact number and the contact number included in the measurement information. Thereafter, the reception part 201 updates the cumulative contact number stored in the cumulative contact number table 2028 in association with the card ID included in the measurement information with the summed value. Thereafter, the reception part 201 outputs the card ID to the transmission part 204.

Subsequently, the tendency specification part 203 refers to the DB 202 and specifies the tendency of changes in measurement results with respect to the contact number for each probe card 176 based on the measurement results and the contact number of each probe needle 177 (S205).

Subsequently, the threshold specification part 205 specifies the first threshold and the second threshold for each probe card 176 based on the change tendency specified by the tendency specification part 203 (S206). In addition, for each probe card 176, the threshold specification part 205 updates the first threshold and the second threshold in the cumulative contact number table 2028 with the specified first threshold and the specified second threshold (S207). Thereafter, the transmission part 204 executes the process illustrated in step S201.

If it is determined that the measurement information has not been received from the inspection apparatus 10 (S203:

"No"), the display control part 200 determines whether or not a display instruction is accepted via the input device 22 (S208). If it is determined that the display instruction is accepted (S208: "Yes"), the display control part 200 refers to the cumulative contact number table 2028 in the DB 202 and creates the image 41 in which the card information is described (see FIG. 12). Thereafter, the display control part 200 causes the created image 41 to be displayed on the display device 21 (S209). The process illustrated in step S200 is executed again.

If it is determined that the display instruction has not been received (S208: "No"), the display control part 200 determines whether or not an event that maintenance has been performed has been inputted via the input device 22 together with the card ID (S210). If it is determined that the event has not been inputted (S210: "No"), the process illustrated in step S200 is executed again.

Meanwhile, if it is determined that the event has been inputted together with the card ID (S210: "Yes"), the card table 2022 associated with the card ID is specified in the measurement history table 2020 of the DB 202. Thereafter, after storing the information, which is stored in the measurement history table 2020 before the maintenance, in another location in the DB 202, the display control part 200 deletes all the measurement results other than the section in which the contact number is "zero" in the specified card table 2022 (S211), In addition, the display control part 200 resets the cumulative contact number associated with the card ID to zero in the measurement history table 2020 of the DB 202 (S212). For the probe card 176 for which the maintenance has been performed, for example, the display color is changed in the image 41 displayed in step S209 such that it can be seen that the maintenance has been performed. The process illustrated in step S200 is executed again.

[Hardware]

Figure 15:
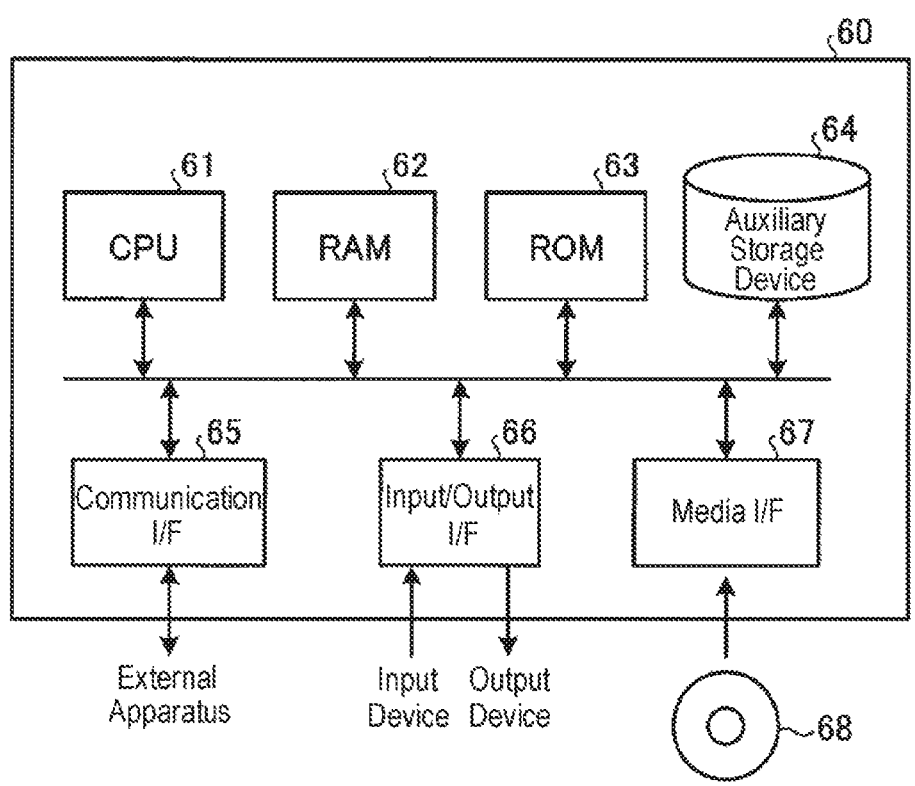
FIG. 15 is a view illustrating an example of a computer hardware that realizes the function of the control unit or the management apparatus according to an embodiment of the present disclosure.

The control unit 12 or the management apparatus 20 described above may be implemented by a computer 60 having hardware shown in FIG. 15. FIG. 15 is a view illustrating an example of the hardware of the computer 60, which realizes the function of the control unit 12 or the management apparatus 20 according to an embodiment of the present disclosure. The computer 60 includes, for example, a central processing unit (CPU) 61, a random access memory (RAM) 62, a read only memory (ROM) 63, and an auxiliary storage device 64. In addition, the computer 60 includes a communication interface (I/F) 65, an input/output interface (I/F) 66, and a media interface (I/F) 67.

The CPU 61 operates according to a program read from the ROM 63 or the auxiliary storage device 64 and deployed on the RAM 62, and controls each part. The ROM 63 stores, for example, a boot program executed by the CPU 61 when the computer 60 is powered, a program depending on the hardware of the computer 60, or the like.

The auxiliary storage device 64 may be a hard disk drive (HDD), a solid-state drive (SSD), or the like, and may store a program executed by the CPU 61, data used by the program, or the like. The CPU 61 reads the program from the auxiliary storage device 64, loads the program on the RAM 62, and executes the loaded program.

The communication I/F 65 performs communication with an external apparatus via a wired or wireless communication line. In the case where the computer 60 functions as the control unit 12, the external apparatuses may be the loader unit 13, the inspection unit 17, and the management apparatus 20. In the case where the computer 60 functions as the management apparatus 20, the external apparatuses may be the plurality of inspection apparatuses 10A, 10B, and 10C.

The communication I/F 65 receives data from the external apparatuses via a communication line and send the data to the CPU 61, and transmits the data generated by the CPU 61 to the external apparatuses via the communication line.

The CPU 61 controls an input device such as a touch panel, and an output device such as a display via the input/output I/F 66, The CPU 61 acquires a signal inputted from the input device via the input/output I/F 66 and sends the same to the CPU 61. In addition, the CPU 61 outputs generated data to the output device via the input/output I/F 66.

The media I/F 67 reads a program or data stored in the recording medium 68, and stores the same in the auxiliary storage device 64. An example of the recording medium 68 may include an optical recording medium such as a digital versatile disk (DVD), a phase change rewritable disk (PD) or the like, a magneto-optical recording medium such as a magneto-optical (MO) disk, a tape medium, a magnetic recording medium, or a semiconductor memory.

In the case where the computer 60 functions as the control unit 12, the CPU 61 executes a program on the RAM 62 such that respective functions of the imaging control part 120, the transmission part 121, the specification part 123, the inspection part 124, the reception part 125, and the acceptance part 126, and the display control part 127 are realized. The auxiliary storage device 64 stores data of the DB 122.

In addition, in the case where the computer 60 functions as the management apparatus 20, the CPU 61 executes the program loaded on the RAM 62 such that respective functions of the display control part 200, the reception part 201, the tendency specification part 203, the transmission part 204, and the threshold specification part 205 are realized. The auxiliary storage device 64 stores data of the DB 202.

The CPU 61 reads the program loaded on the RAM 62 from the recording medium 68 and stores the same in the auxiliary storage device 64. As another example, the CPU 61 acquires a program from another device via a communication line and may store the program in the auxiliary storage device 64.

In the foregoing, the embodiments have been described. As described above, the probe card management system 1 of this embodiment includes the plurality of inspection apparatuses 10 that inspect the wafers W, and the management apparatus 20 that manages the state of the probe card 176 used for the inspection of the waters W. Each of the inspection apparatuses 10 includes the camera 178, the inspection part 124, and the transmission part 121. The camera 178 captures the tips of the plurality of probe needles 177 provided on the probe card 176. The inspection part 124 measures the states of the tips of the probe needles 177 from images captured by the camera 178, brings the tips of the probe needles 177 into contact with the plurality of respective test pads provided on the wafer W based on the measurement results, and supplies an electrical signal to the wafer W through the tips of the plurality of probe needles 177 thus inspecting the wafer W. The transmission part 121 transmits the measurement results and the number of executions of the inspection performed by the probe card 176 to the management apparatus 20. The management apparatus 20 includes the threshold specification part 205 and the transmission part 204. For each probe card 176, the threshold specification part 205 specifies the first threshold indicating a threshold for the number of executions until the lifespan of the probe card 176 expires, based on the measurement results and the number of executions. For each probe card 176, the transmission part 204 notifies the outside, such as the user, of the number of executions up to now and the first threshold. This enables the probe card management system 1 to manage the lifespan of each probe card 176 with high accuracy.

In addition, in the above-described embodiments, the management apparatus 20 includes the tendency specification part 203 that specifies the tendency of the change in the measurement results with respect to the number of executions. The threshold specification part 205 specifies the first threshold for each probe card 176 based on the change tendency specified by the tendency specification part 203.

In the above-described embodiments, the threshold specification part 205 further specifies, for each probe card 176, the second threshold that indicates a threshold for the number of executions of the inspection until the maintenance of the probe card 176 is required based on the tendency of change in the measurement results. The transmission part 204 further notifies the outside, such as the user, of the second threshold for each probe card 176. Thereby, the user is able to recognize how many inspections can be executed until the maintenance of the probe card 176 is required.

In the embodiments described above, the management apparatus 20 includes the display control part 200 that, for each probe card 176, causes the first threshold and the second threshold to be displayed on the display device 21. Thereby, the user of the management apparatus 20 is able to easily manage one, of which the maintenance period or the lifespan is approaching, among the plurality of probe cards 176.

In the embodiments described above, for a probe card 176, of which the number of executions up to now differs from the first threshold by the first number or less, the display control part 200 causes the first threshold to be highlighted on the display device 21. In addition, for a probe card 176, of which the number of executions up to now differs from the second threshold by the second number or less, the display control part 200 causes the second threshold to be highlighted on the display device 21. Thereby, the user of the management apparatus 20 is able to quickly recognize one, of which the maintenance period is approaching, among the plurality of probe cards 176.

In the embodiments described above, the management apparatus 20 includes the DB 202 that holds the measurement results and the number of executions for each probe card 176. When the maintenance of the probe card 176 has been performed, the display control part 200 deletes the measurement results and the number of executions of the respective probe card 176 from the DB 202. Thereby, it is possible to manage a subsequent maintenance period and lifespan of the probe card 176 after maintenance with high accuracy.

In the embodiments described above, the measurement results of the tip of each probe needle 177 measured by the specification part 123 include the measurement values of the position and size of the tip of each probe needle 177. Thereby, it is possible to specify the tendency of a wear state of the tip of each probe needle 177 from the tendency of changes in the measurement results.

In the embodiments described above, using the images captured by the camera 178 such that the tips of the plurality of probe needles 177 are in one image at each position in the height direction of each probe needle 177, the specification part 123 specifies, for each probe needle 177, the position of the tip of the probe needle 177 based on the image of the focused tip of the probe needle 177 and the position of the camera 178 when the image was captured. Thereby, it is possible to specify the position of the tip of each probe needle 177 with high accuracy in a short period of time.

[Others]

The techniques disclosed herein are not limited to the embodiments described above, and various modifications are possible within the scope of the present disclosure.

For example, in the embodiments described above, the sticker or the like on which the card ID is written is affixed to each probe card 176, and the control unit 12 acquires the card ID of the probe card 176 from the image captured by the camera 178, but is not limited thereto. In some embodiments, an RF tag in which a card. ID is recorded may be attached to each probe card 176, and the control unit 12 may acquire the card ID in the RF tag via a reading device provided in the inspection unit 17.

In addition, in the embodiments described above, the probe card 176 is aligned before the start of inspection, and subsequently, the probe card 176 is aligned each time when the inspection of wafers W, the number of which was designated by the user, is completed. However, the techniques disclosed herein are not limited thereto. The probe card 176 may be aligned each time when the inspection of one wafer W is completed. Alternatively, the inspection may be performed each time when the inspection of a predetermined number of wafers e.g., 2.5 wafers) is completed regardless of the number designated by the user.

According to various aspects and embodiments of the present disclosure, it is possible to manage the lifespan of a probe card with high accuracy.

It should be noted that the embodiments disclosed herein are exemplary in all respects and are not restrictive. Indeed, the above-described embodiments may be modified in various forms. For example, an inspection apparatus including multiple inspection units for one or multiple loader units, may be used. In this case, this inspection apparatus may be regarded as a single inspection apparatus. The multiple inspection units may be regarded as multiple inspection apparatuses. The embodiments described above may be omitted, replaced, or modified in various forms without departing from the scope and spirit of the accompanying claims.

What is claimed is:

1. A probe card management system comprising:
   a plurality of inspection apparatuses each configured to inspect an inspection object; and
   a management apparatus configured to manage a state of a probe card used for inspecting the inspection object,
   wherein each of the plurality of inspection apparatuses comprises:
      a camera configured to capture images of tips of a plurality of probe needles provided on the probe card;
      an inspection part configured to measure a state of the tip of each of the plurality of probe needles from the images captured by the camera; and inspect the inspection object by bringing the tip of each of the plurality of probe needles into contact with each of a plurality of test pads provided on the inspection object based on a result of the measurement, and supplying an electrical signal to the inspection object through the tips of the plurality of probe needles; and
      a transmission part configured to transmit the measurement result and a number of executions of the inspection performed by the probe card to the management apparatus, and
   wherein the management apparatus comprises:

a tendency specification part configured to specify a tendency of change in the measurement result with respect to a cumulative number of executions of the inspection;

a threshold specification part configured to specify, for each probe card, a first threshold indicating a threshold for the cumulative number of executions until a lifespan of the probe card expires, based on the tendency of change in the measurement result and the cumulative number of executions; and a notification part configured to notify an outside of the cumulative number of executions and the first threshold value for each probe card.

2. The probe card management system of claim 1, wherein the threshold specification part further specifies, for each probe card, a second threshold indicating a threshold of the cumulative number of executions of the inspection until a maintenance of the probe card is required based on the tendency of change, and the notification part further notifies the outside of the second threshold for each probe card.

3. The probe card management system of claim 2, wherein the management apparatus includes a data management part configured to cause, for each probe card, the first threshold and the second threshold to be displayed on the display device together with the cumulative number of executions.

4. The probe card management system of claim 3, wherein, for the probe card, of which the cumulative number of executions differs from the first threshold by a first number or less, the data management part causes the first threshold to be highlighted on the display device, and for the probe card, of which the cumulative number of executions differs from the second threshold by a second number or less, the data management part causes the second threshold to be highlighted on the display device.

5. The probe card management system of claim 4, wherein the management apparatus includes a storing part configured to store the measurement result and the cumulative number of executions for each probe card, and when the maintenance of the probe card has been performed, the data management part deletes the measurement result and the cumulative number of executions for each probe card from the storing part.

6. The probe card management system of claim 5, wherein the measurement result includes measurement values of a position and size of the tip of each of the plurality of probe needles.

7. The probe card management system of claim 6, wherein the inspection apparatus further comprises a specification part, wherein the specification part is configured to, using the images that were captured by the camera at each position of each of the plurality of probe needles in a height direction such that the tips of the plurality of probe needles are captured in one image, specify a position of the tip of each of the plurality of probe needles, based on an image of a focused tip of each of the plurality of probe needles and a position of the camera when the image was captured.

8. The probe card management system of claim 3, wherein the management apparatus includes a storing part configured to store the measurement result and the cumulative number of executions for each probe card, and when the maintenance of the probe card has been performed, the data management part deletes the measurement result and the cumulative number of executions for each probe card from the storing part.

9. The probe card management system of claim 2, wherein the threshold specification part specifies the second threshold based on a straight line specified as the tendency of change by the tendency specification part, the measurement result, and a width of a tip of a probe needle when a maintenance of the probe needle is required.

10. The probe card management system of claim 1, wherein the measurement result includes measurement values of a position and size of the tip of each of the plurality of probe needles.

11. The probe card management system of claim 1, wherein the threshold specification part specifies the first threshold based on a straight line specified as the tendency of change by the tendency specification part, the measurement result, and a width of a tip of a probe needle when a lifespan of the probe needle expires.

12. A probe card management method used for a probe card management system including a plurality of inspection apparatuses configured to inspect an inspection object and a management apparatus configured to manage a state of a probe card used for inspecting the inspection object, the method comprising:

a capturing step of capturing an image of each of a plurality of probe needles provided on the probe card using a camera of each of the plurality of inspection apparatuses;

a measurement step of measuring a state of each of the plurality of probe needles from the image captured by the camera;

an inspection step of inspecting the inspection object by bringing a tip of each of the plurality of probe needles into contact with each of a plurality of test pads provided on the inspection object using the probe card of each of the plurality of inspection apparatuses and supplying an electrical signal to the inspection object through the tips of the plurality of probe needles;

a transmission step of transmitting a measurement result obtained in the measurement step and a number of executions of the inspection performed by the probe card to the management apparatus;

a tendency specification step by the management apparatus of specifying a tendency of change in the measurement result with respect to a cumulative number of executions of the inspection;

a threshold specification step by the management apparatus of specifying, for each probe card, a first threshold indicating a threshold for the cumulative number of executions until a lifespan of the probe card expires, based on the tendency of change in the measurement result and the cumulative number of executions; and a notification step by the management apparatus of notifying an outside of the cumulative number of executions and the first threshold value for each probe card.

13. The probe card management method of claim 12, wherein the tendency specification step further includes specifying a straight line as the tendency of change, and wherein the threshold specification step further includes specifying the first threshold based on the straight line, the measurement result, and a width of a tip of a probe needle when a lifespan of the probe needle expires.

14. The probe card management method of claim 12, wherein the threshold specification step further include specifying, for each probe card, a second threshold indicating a threshold of the cumulative number of executions of the inspection until a maintenance of the probe card is required based on the tendency of change, and wherein the notification step further including notifying the outside of the second threshold for each probe card.

15. The probe card management method of claim 14, wherein the tendency specification step further includes specifying a straight line as the tendency of change, and wherein the threshold specification step further includes specifying the second threshold based on the straight line, the measurement result, and a width of a tip of a probe needle when a maintenance of the probe needle is required.

* * * * *